(12) United States Patent
Koechlin

(10) Patent No.: US 8,928,431 B2
(45) Date of Patent: Jan. 6, 2015

(54) WIDEBAND ANALOG LOWPASS FILTER

(75) Inventor: Michael Koechlin, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 638 days.

(21) Appl. No.: 12/931,499

(22) Filed: Feb. 1, 2011

(65) Prior Publication Data

US 2011/0187449 A1    Aug. 4, 2011

Related U.S. Application Data

(60) Provisional application No. 61/337,515, filed on Feb. 4, 2010.

(51) Int. Cl.
| | | |
|---|---|---|
| *H03H 7/06* | (2006.01) | |
| *H03J 3/20* | (2006.01) | |
| *H01P 1/203* | (2006.01) | |
| *H03H 7/01* | (2006.01) | |

(52) U.S. Cl.
CPC ............... *H03J 3/20* (2013.01); *H01P 1/20381* (2013.01); *H03H 7/0153* (2013.01); *H03H 7/06* (2013.01)
USPC .......................................... 333/174; 333/168

(58) Field of Classification Search
CPC ...... H03H 7/06; H03H 7/0123; H03H 7/1766
USPC ......... 333/204, 205, 219, 235, 175, 176, 168, 333/238, 246, 174; 336/12, 192
See application file for complete search history.

(56) References Cited

U.S. PATENT DOCUMENTS

| | | | | |
|---|---|---|---|---|
| 3,271,705 | A * | 9/1966 | Karkar ........................ | 333/176 |
| 5,032,808 | A * | 7/1991 | Reddy ........................ | 333/181 |
| 5,173,671 | A | 12/1992 | Wendler et al. | |
| 5,959,515 | A * | 9/1999 | Cornett et al. ................. | 334/14 |
| 6,018,282 | A * | 1/2000 | Tsuda ........................ | 333/205 |
| 6,518,859 | B1 * | 2/2003 | Spampinato ................. | 333/174 |
| 7,202,726 | B2 * | 4/2007 | Kunanayagam et al. ..... | 327/274 |
| 7,305,223 | B2 * | 12/2007 | Liu et al. ....................... | 455/333 |
| 8,305,164 | B1 * | 11/2012 | Jachowski .................. | 333/205 |
| 2005/0134398 | A1 | 6/2005 | Myong et al. | |
| 2009/0179713 | A1 | 7/2009 | Zeng et al. | |
| 2009/0237178 | A1 | 9/2009 | Lee et al. | |

* cited by examiner

*Primary Examiner* — Robert Pascal
*Assistant Examiner* — Gerald Stevens
(74) *Attorney, Agent, or Firm* — Knobbe, Martens, Olson & Bear, LLP

(57) ABSTRACT

A low pass filter includes an RF input terminal, an RF output terminal, a plurality of inductors coupled in series between the RF input and output terminals, at least one electrically tunable capacitor coupled between ground and a node of one of the inductors. At least one of the inductors includes a winding, and a resistance and a capacitance coupled in series across a portion of the winding to enhance the out of band rejection of the low pass filter.

27 Claims, 6 Drawing Sheets

WIDEBAND ANALOG LOWPASS FILTER

RELATED APPLICATIONS

This application hereby claims the benefit of and priority to U.S. Provisional Application Ser. No. 61/337,515, filed on Feb. 4, 2010 under 35 U.S.C. §§119, 120, 363, 365, and 37 C.F.R. §1.55 and §1.78, which application is herein incorporated by reference.

FIELD OF THE INVENTION

The invention relates to a lowpass filter.

BACKGROUND OF THE INVENTION

Lowpass filters are known in the art. One type of a lowpass filter is a Chebyshev filter that uses fixed values for its inductors and capacitors. Once the fixed values of the inductors and capacitors are selected, the cutoff frequency of the filter cannot typically be varied without changing components.

There are many applications in which it is desirable to have an RF lowpass filter which is tunable in cutoff frequency. It is also desirable for a lowpass filter to have high linearity such that a minimal amount of additional spurious are generated when subjected to an input spectrum with multiple tones.

BRIEF SUMMARY OF THE INVENTION

It is therefore an object of this invention to provide a lowpass filter that has high linearity.

It is a further object of this invention to provide such a lowpass filter which is tunable in its cutoff frequency.

The invention results from the realization that a low pass filter having high linearity and which has a tunable cutoff frequency can be achieved by a plurality of inductors coupled in series between RF input and output terminals, and at least one electrically tunable capacitor coupled to a node of one of the inductors, in which each of the inductors includes a winding, and a resistance and a capacitance coupled in series across a portion of the winding to the enhance the out of band rejection of the low pass filter.

The subject invention, however, in other embodiments, need not achieve all these objectives and the claims hereof should not be limited to structures or methods capable of achieving these objectives.

In one embodiment, the subject invention features a low pass filter which includes an RF input terminal; an RF output terminal; a plurality of inductors coupled in series between the RF input and output terminals; and at least one electrically tunable capacitor coupled to a node of one of the inductors; at least one of the inductors including a winding, and a resistance and a capacitance coupled in series across a portion of the winding to enhance the out of band rejection of the low pass filter.

In a preferred embodiment, the resistance and the capacitance are coupled in series between two nodes that have a phase difference of approximately 180 degrees at a frequency at which the inductor becomes resonant. A magnitude of a reactance of the capacitance may be approximately equal to a value of the resistor at the resonant frequency of the inductor.

The electrically tunable capacitors may each include a varactor. Each of the varactors may include two diodes coupled together anode to anode or cathode to cathode.

Each of the varactors may alternatively include one diode. Each of the varactors may include a p-n junction. Each of the varactors may include a field effect transistor (FET) and use the capacitance between a gate and a source of the FET.

Each electrically tunable capacitor may include a ferroelectric based capacitor. Each electrically tunable capacitor may include a MEMS-based capacitor. The electrically tunable capacitors may be coupled between ground and the node of one of the inductors.

The filter may also include a control circuit coupled to the electrically tunable capacitors to adjust the cut off frequency of the filter. The control circuit may include a frequency control terminal, and an inductance and a resistance coupled in series between the frequency control terminal and each of the tunable capacitors for tuning the tunable capacitors.

The filter may be implemented on a planar monolithic substrate. The monolithic substrate may be selected from the group of GaAs or SiGe. The monolithic substrate may be mounted in a surface-mount package.

Each of the inductors may be a lumped inductor. Each of the inductors may be a spiral inductor.

In another embodiment, the subject invention features a low pass filter which includes an RF input terminal; an RF output terminal; a plurality of inductors coupled in series between the RF input and output terminals; at least one electrically tunable capacitor coupled between ground and a node of one of the inductors; and a control circuit coupled to the electrically tunable capacitors of the resonating circuits to adjust the cut off frequency of the filter; each of the inductors including a winding, and a resistance and a capacitance coupled in series across two nodes of the winding that have a phase difference of approximately 180 degrees at a frequency at which the inductor becomes resonant to enhance the out of band rejection of the low pass filter.

In a preferred embodiment, the plurality of electrically tunable capacitors each includes a varactor. Each of the varactors may include two diodes coupled together anode to anode or cathode to cathode. Each of the varactors may include one diode.

In another embodiment, an inductor includes a winding, and a resistance and a capacitance coupled in series across a portion of the winding to enhance the out of band rejection of the inductor, the resistance and the capacitance coupled in series between two nodes of the winding that have a phase difference of approximately 180 degrees at a frequency at which the inductor becomes resonant. The magnitude of a reactance of the capacitance may be approximately equal to a value of the resistor at the resonant frequency of the inductor.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
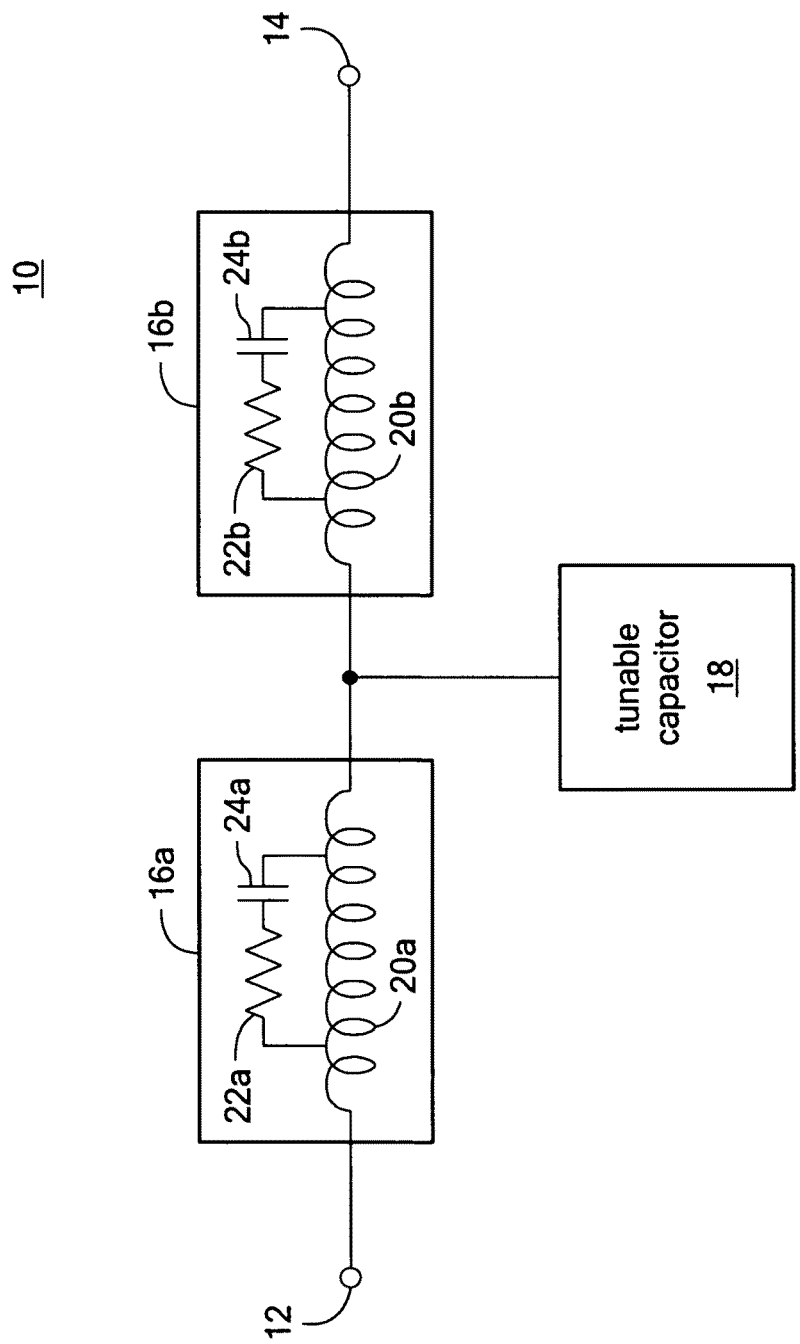
FIG. 1 is a schematic diagram of one embodiment of the wideband lowpass filter in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a wideband analog lowpass filter 10 in accordance with the invention that includes an RF input terminal 12, an RF output terminal 14, and a plurality of inductors 16a-b coupled in series between the RF input and output terminals. At least one electrically tunable capacitor 18 is coupled to a node of one of inductors 16a-b. Each of the inductors 16a-b respectively includes a winding 20a-b, and a resistance 22a-b and a capacitance 24a-b coupled in series across a portion of the winding to enhance the out of band rejection of the low pass filter.

Figure 2:
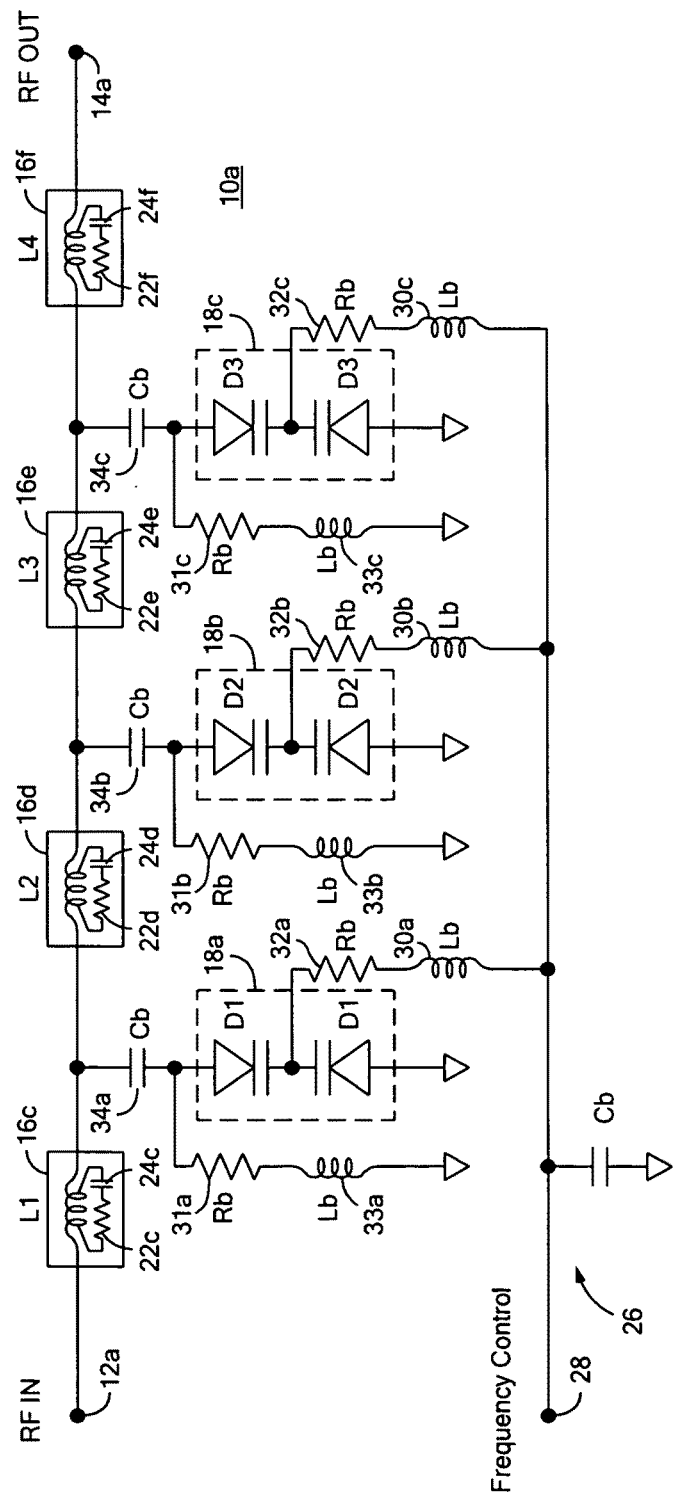
FIG. 2 is a circuit diagram of a more detailed embodiment of the wideband lowpass filter of FIG. 1.

Another embodiment of wideband analog lowpass filter 10a, FIG. 2, takes the configuration of a seventh-order lumped element Chebyshev filter. Filter 10a includes back to back varactors 18a-18c to provide electrically tunable capacitance. Although single varactors may be used, the back to back varactors provide improved linearity performance over a single varactor implementation.

A control circuit 26 is coupled to the pairs of tunable varactors 18a-18c to adjust the cut off frequency of the filter. Control circuit 26 includes a frequency control terminal 28, and inductors 30a-c and resistors 32a-c coupled in series between the frequency control terminal and the cathodes of each of the pairs of tunable varactors 18a-18c for tuning the varactors. Inductor 33a-c and resistors 31a-c also provide a dc return for some of the anodes of the pairs of varactors 18a-18c that are not already directly grounded. The pairs of varactors 18a-18c are respectively ac coupled to inductors 16a-c through capacitors 34a-c. The reactance of capacitors 34a-c are respectively very small compared to the reactance of the pairs of back to back varactors 18a-18c.

Inductors 16c-f have embedded resistors 22c-f and capacitors 24c-f which provide significant additional out of band rejection in the frequency range where distributed circuit effects, such as parasitic capacitance inherent in the physical layout of the inductors typically don't provide the lumped element equivalent inductance as was the case in the frequency range of the pass band. Inductors 16c-f may be implemented as lumped inductors and/or as planar spiral inductors.

Although the embodiment of filter 10a includes four inductors 16c-f, the subject invention could include any number of inductors. Indeed, one embodiment of the invention includes a single inductor 16a having a winding 20a, and a resistance 22a and a capacitance 24a coupled in series across a portion of the winding to enhance the out of band rejection of the inductor. Filter 10a could also take the configuration of any type of filter topology which incorporates lumped element equivalent inductors, such as for example, Butterworth, Eliptic, Bessel, Cauer filters, etc.

The linearity of filter 10a is improved by incorporating back to back pairs of varactors in the filter substantially eliminating the non-symmetrical variation of capacitance under ac excitation around a given dc operating point. The back to back pairs of varactors 18a-c in FIG. 2 are shown coupled as cathode to cathode, but each may alternatively be coupled as anode to anode. Other electrically tunable capacitors could be used instead of back to back pairs of tunable varactors 18a-18c, such as a single varactor, a ferroelectric based capacitor, a MEMS-based capacitor, and/or a field effect transistor (FET) that uses the capacitance between the gate and the source of the FET.

Figures 3A, 3B:
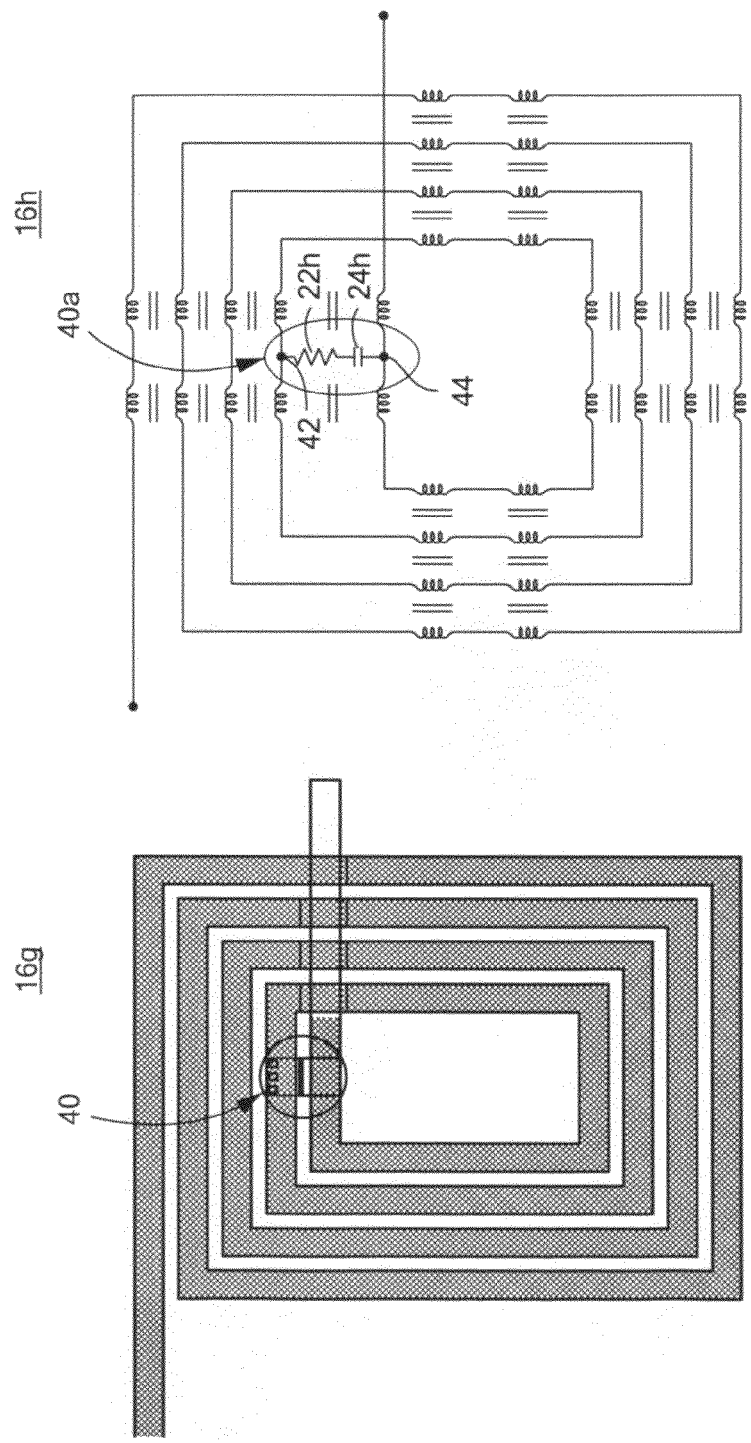
FIGS. 3a and 3b are a schematic diagram and an equivalent circuit diagram of one of the inductors of FIG. 2.

A layout, FIG. 3a, of one embodiment of inductor 16g shows an exemplary location of the resistor and capacitor 40 within inductor 16g. The location of the resistor and capacitor 40 is dependent on the inductor layout and may be determined by examination of a finite element analysis of the structure showing the electromagnetic field distribution. The resistor and capacitor 40 are preferably placed between nodes which have a phase difference of approximately 180 degrees at the frequency where inductor 16g becomes resonant. This has the desirable effect of absorbing the energy in the frequency range where the inductor is resonant while having only a very small effect on the performance of inductor 16g (and in turn filter 10a) in the frequency range of the pass band. FIG. 3b shows the equivalent low frequency lumped element inductor model 16h of inductor 16g which illustrates an example of resistor 22h and capacitor 24h coupled in series across a portion of the inductor winding between nodes 42 and 44 to enhance the out of band rejection of the low pass filter.

Preferably, the magnitude of the reactance of the capacitor 24h is approximately equal to the value of resistor 22h at the resonant frequency of the inductor. This helps to ensure that there is minimal impact to the performance of the inductor in the passband.

Figure 4:
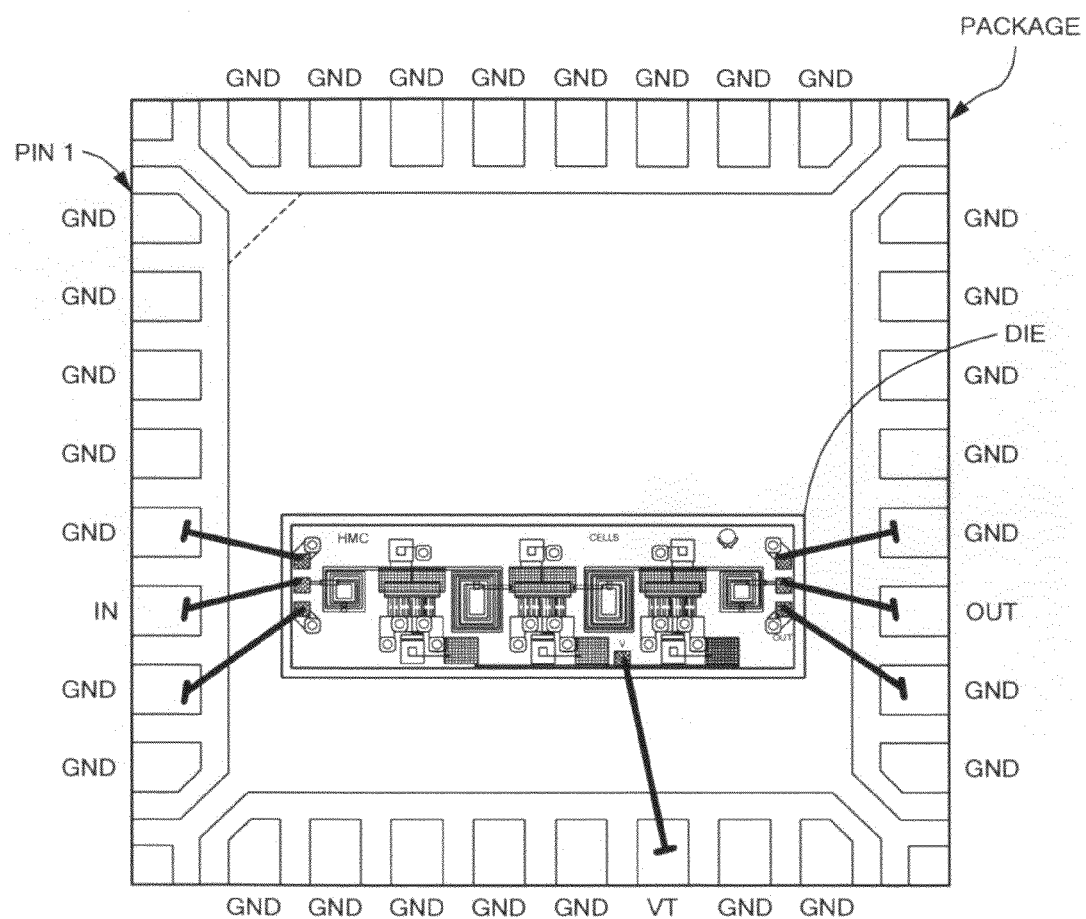
FIG. 4 is a layout of a die and the bonding diagram for the wideband lowpass filter of FIG. 2.

One possible layout of the MMIC die and bonding diagram 50, FIG. 4, shows how the MMIC die can be assembled into a surface mount package which enables use of low-cost assembly technology. The filter may be implemented on a planar monolithic substrate which for example may be a GaAs or SiGe substrate.

Figure 5A:
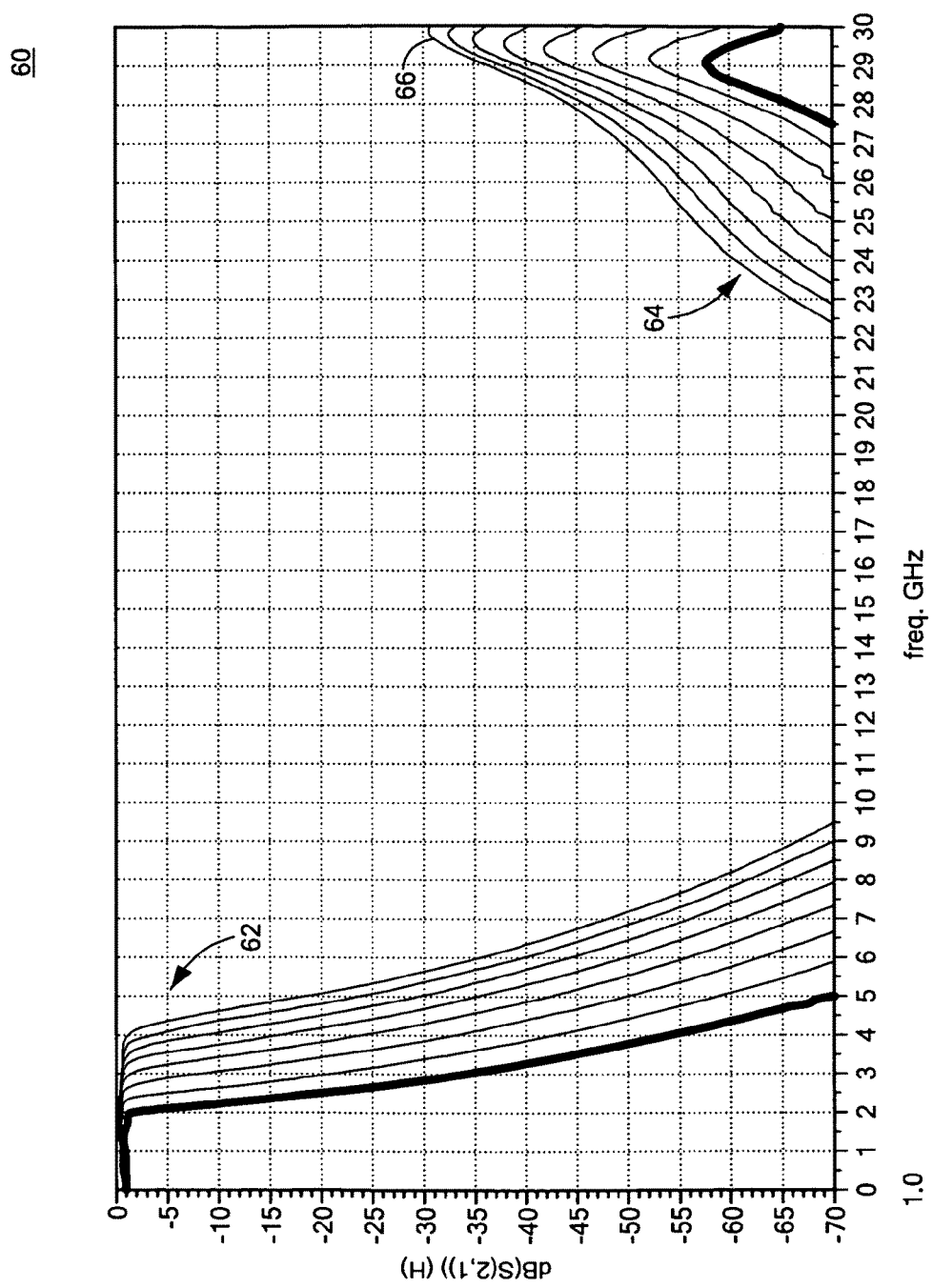
FIGS. 5a and 5b are plots showing the response of the lowpass filter as a function of the tuning voltage with and without resonance suppression, respectively.
Figure 5B:
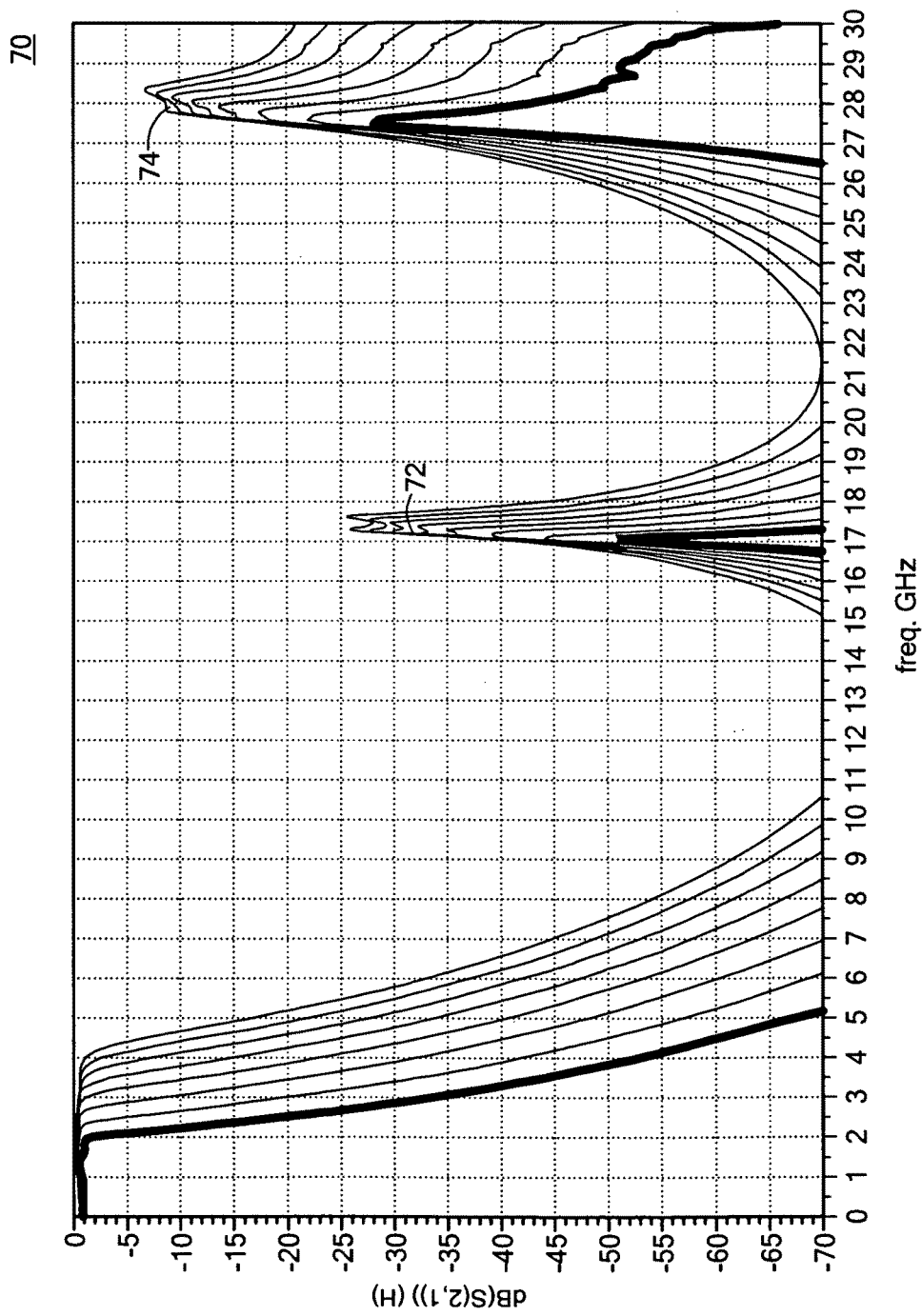

The response 60, FIG. 5a, of the lowpass filter 10a shows the insertion loss of the lowpass filter as the tuning voltage applied to the cathodes of varactors 18a-c is varied across the range of 0 to 14 volts. The corner or cutoff frequency 62 of filter 10a tunes from 2 GHz to 4 GHz. The 60 dB stop band 64 of this filter extends to 24 GHz and the out of band rejection 66 is still 30 dB at 30 GHz. In contrast to the subject invention, the response 70, FIG. 5b, of the lowpass filter 10a without resistors 22c-22f and capacitors 24c-24f in inductors 16c-16f shows the presence of a large secondary pass band 72 at 17 GHz and the rejection 74 at 28 GHz has only been reduced to less than 10 dB, which illustrates the effectiveness of the subject invention at significantly improving the out of band rejection.

Embodiments of the invention provide a lowpass filter which has a tunable cutoff frequency and has high linearity such that a minimal amount of additional spurious are generated when subjected to an input spectrum with multiple tones. In addition the out of band rejection may remain high and extend several octaves or more beyond the initial stop band to insure that spurious far from carrier do not re-enter the system in some non obvious fashion. This performance may be achieved with relatively low and flat insertion loss. Embodiments of the invention may also be realized on a monolithic substrate to benefit from the consistency of the many reactive elements, reduced size, low cost, and the possibility to integrate other active or passive circuit functions on the same die.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A lowpass filter, comprising:
an RF input terminal;
an RF output terminal;
a plurality of inductors coupled in series between the RF input and output terminals;
at least one electrically tunable capacitor coupled to a first node of one of the inductors; and
at least one of the inductors including:
a winding including a first end, a second end and a pair of nodes defining a portion of the winding between the first end and the second;
a resistor; and
a capacitor,
the resistor coupled in series with the capacitor, the resistor and the capacitor coupled in parallel across the portion of the winding defined by the pair of nodes to enhance the out of band rejection of the low-pass filter.

2. The filter of claim 1, in which the pair of nodes have a phase difference of approximately 180 degrees at a frequency at which one of the plurality of inductors becomes resonant.

3. The filter of claim 1, in which the at least one tunable capacitor includes a plurality of electrically tunable capacitors each including a varactor.

4. The filter of claim 3 in which each of the varactors includes two diodes coupled together anode to anode or cathode to cathode.

5. The filter of claim 3 in which each of the varactors includes a p-n junction.

6. The filter of claim 3 in which each of the varactors includes a field effect transistor (FET) and uses a capacitance between a gate and a source of the FET.

7. The filter of claim 3 in which each of the varactors includes one diode.

8. The filter of claim 1, further including a control circuit coupled to the at least one electrically tunable capacitor to adjust the cut off frequency of the filter.

9. The filter of claim 8 in which the control circuit includes a frequency control terminal, and an inductance and a resistor coupled in series between the frequency control terminal and the at least one electrically tunable capacitor for tuning the at least one tunable capacitor.

10. The filter of claim 1 in which the filter is implemented on a planar monolithic substrate.

11. The filter of claim 10 in which the monolithic substrate is selected from the group of GaAs or SiGe.

12. The filter of claim 10 in which the monolithic substrate is mounted in a surface-mount package.

13. The filter of claim 1 in which each electrically tunable capacitor includes a ferroelectric based capacitor.

14. The filter of claim 1 in which each electrically tunable capacitor includes a MEMS-based capacitor.

15. The filter of claim 1 in which each of the plurality of inductors is a lumped inductor.

16. The filter of claim 1 in which each of the plurality of inductors is a spiral inductor.

17. The filter of claim 1 in which the at least one electrically tunable capacitor is coupled between ground and the first node of said one of the inductors.

18. The filter of claim 1 in which a magnitude of a reactance of the capacitor is approximately equal to a value of the resistor at the resonant frequency of the inductor.

19. A lowpass filter, comprising:
an RF input terminal;
an RF output terminal;
a plurality of inductors coupled in series between the RF input and output terminals;
at least one electrically tunable capacitor coupled between ground and a first node of one of the inductors; and
a control circuit coupled to the electrically tunable capacitors of the resonating circuits to adjust the cut off frequency of the filter;
each of the inductors including:
a winding including a first end, a second end and a pair of nodes defining a portion of the winding between the first end and the second end;
a resistor; and
a capacitor coupled in series with the resistor, the resistor and the capacitor coupled in parallel across the portion of the winding defined by the pair of nodes, the pair of nodes having a phase difference of approximately 180 degrees at a frequency at which the inductor becomes resonant, to enhance the out of band rejection of the lowpass filter.

20. The filter of claim 19, in which the plurality of electrically tunable capacitors each include a varactor.

21. The filter of claim 20 in which each of the varactors includes two diodes coupled together anode to anode or cathode to cathode.

22. The filter of claim 20 in which each of the varactors includes one diode.

23. An inductor, comprising:
a winding; and
a resistance and a capacitance coupled in series across a portion of the winding to enhance the out of band rejection of the inductor, the resistance and the capacitance coupled in series between two nodes of the winding that have a phase difference of approximately 180 degrees at a frequency at which the inductor becomes resonant.

24. The inductor of claim 23 in which a magnitude of a reactance of the capacitance is approximately equal to a value of the resistor at the resonant frequency of the inductor.

25. An inductor comprising:
a winding including a first end, a second end and a pair of nodes defining a portion of the winding between the first end and the second end;
a resistor; and
a capacitor coupled in series with the resistor, the resistor and the capacitor coupled in parallel across the portion of the winding defined by the pair of nodes, the pair of nodes having a phase difference of approximately 180 degrees at a frequency at which the inductor becomes resonant.

26. The inductor of claim 25 in which a magnitude of a reactance of the capacitor is approximately equal to a value of the resistor at the resonant frequency of the inductor.

27. A lowpass filter, comprising:
an RF input terminal;
an RF output terminal;
a plurality of inductors coupled in series between the RF input and output terminals; and
at least one electrically tunable capacitor coupled to a node of one of the inductors;
at least one of the inductors including a winding, and
a resistance and a capacitance coupled in series across a portion of the winding to enhance the out of band rejection of the low-pass filter, in which a magnitude of a reactance of the capacitance is approximately equal to a value of the resistance at the resonant frequency of the inductor.

* * * * *

UNITED STATES PATENT AND TRADEMARK OFFICE
CERTIFICATE OF CORRECTION

PATENT NO. : 8,928,431 B2  Page 1 of 1
APPLICATION NO. : 12/931499
DATED : January 6, 2015
INVENTOR(S) : Michael Koechlin It is certified that error appears in the above-identified patent and that said Letters Patent is hereby corrected as shown below:

In the Claims,

In column 5 at line 28, in Claim 1, change "second;" to --second end;--.

Signed and Sealed this
Eighth Day of September, 2015

Michelle K. Lee
*Director of the United States Patent and Trademark Office*